United States Patent
Muraki et al.

(10) Patent No.: US 10,361,067 B2
(45) Date of Patent: Jul. 23, 2019

(54) DRAWING APPARATUS, AND METHOD OF MANUFACTURING ARTICLE BY CONTROLLING A PLURALITY OF CHARGED PARTICLE OPTICAL SYSTEMS BASED ON RESPECTIVE SETS OF SUB-DRAWING REGIONS

(71) Applicant: CANON KABUSHIKI KAISHA, Tokyo (JP)

(72) Inventors: Masato Muraki, Inagi (JP); Go Tsuchiya, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/302,885

(22) Filed: Jun. 12, 2014

(65) Prior Publication Data
US 2015/0001419 A1 Jan. 1, 2015

(30) Foreign Application Priority Data
Jun. 26, 2013 (JP) .................. 2013-134210

(51) Int. Cl.
*H01J 37/302* (2006.01)
*H01J 37/317* (2006.01)
(52) U.S. Cl.
CPC ...... *H01J 37/3177* (2013.01); *H01J 37/3026* (2013.01); *H01J 2237/31764* (2013.01)
(58) Field of Classification Search
CPC .............................................. H01J 37/31764
See application file for complete search history.

(56) References Cited

U.S. PATENT DOCUMENTS

| 4,694,178 A * | 9/1987 | Harte | B82Y 10/00 250/396 R |
|---|---|---|---|
| 5,834,783 A * | 11/1998 | Muraki | B82Y 10/00 250/396 R |
| 6,218,060 B1 | 4/2001 | Yasuda et al. | |

(Continued)

FOREIGN PATENT DOCUMENTS

| JP | H11329322 A | 11/1999 |
| JP | 2005-129944 A | 5/2005 |
| JP | 2006019434 A | 1/2006 |

OTHER PUBLICATIONS

Office Action issued in Japanese Appln. No. 2013-134210 dated Mar. 17, 2017.

*Primary Examiner* — Wyatt A Stoffa
*Assistant Examiner* — James Choi
(74) *Attorney, Agent, or Firm* — Rossi, Kimms & McDowell LLP

(57) ABSTRACT

A drawing apparatus includes: a plurality of charged particle optical systems arranged along a first direction; a storage configured to store drawing data shared by the plurality of charged particle optical systems with respect to each of sub-drawing regions obtained by dividing a drawing region on the substrate of each of the plurality of charged particle optical systems in the first direction; and a controller configured to determine a drawing region on the substrate by each of the plurality of charged particle optical systems as a set of the sub-drawing regions, and control each of the plurality of charged particle optical systems based on a corresponding set of the sub-drawing regions.

8 Claims, 7 Drawing Sheets

(56) References Cited

U.S. PATENT DOCUMENTS

| | | | | |
|---|---|---|---|---|
| 6,313,476 | B1* | 11/2001 | Shimizu | B82Y 10/00 250/492.22 |
| 6,333,138 | B1* | 12/2001 | Higashikawa | B82Y 10/00 430/296 |
| 2004/0188636 | A1* | 9/2004 | Hosoda | B82Y 10/00 250/492.22 |
| 2005/0104013 | A1 | 5/2005 | Stengl et al. | |
| 2009/0057570 | A1* | 3/2009 | Abe | B82Y 10/00 250/492.2 |
| 2011/0073782 | A1* | 3/2011 | Wieland | B82Y 10/00 250/492.22 |

* cited by examiner

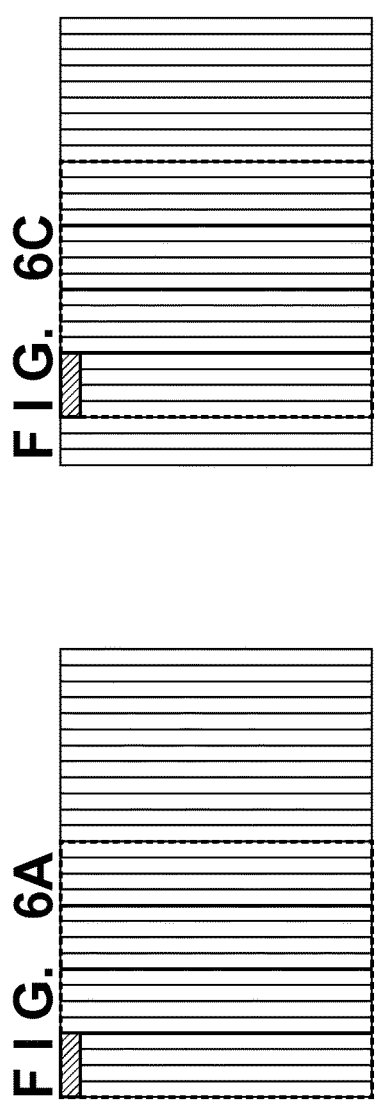
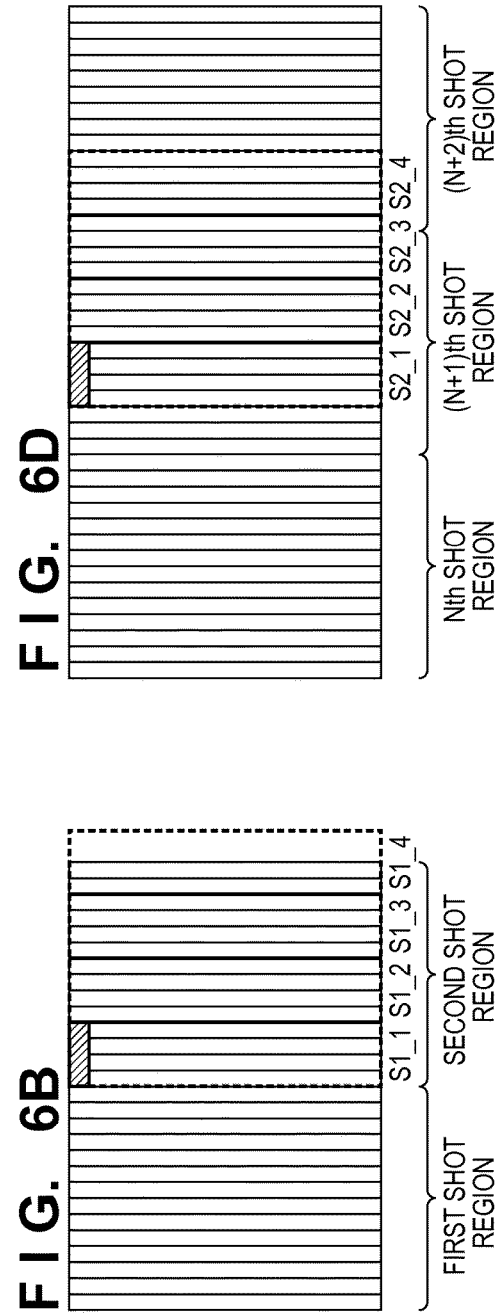
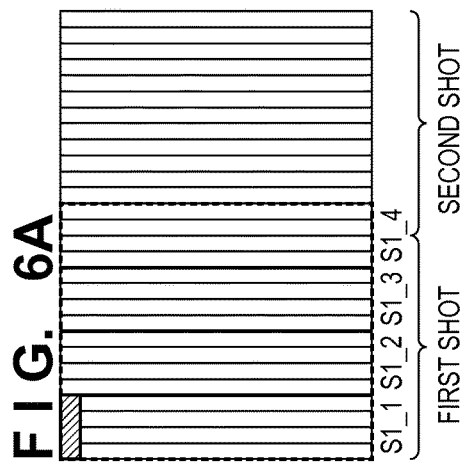
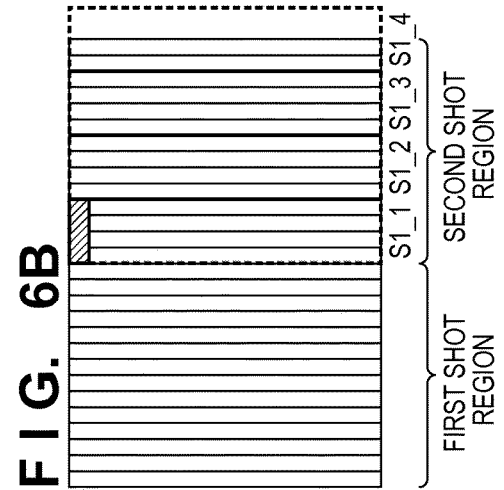

DRAWING APPARATUS, AND METHOD OF MANUFACTURING ARTICLE BY CONTROLLING A PLURALITY OF CHARGED PARTICLE OPTICAL SYSTEMS BASED ON RESPECTIVE SETS OF SUB-DRAWING REGIONS

BACKGROUND OF THE INVENTION

Field of the Invention

The present invention relates to a drawing apparatus, and a method of manufacturing an article.

Description of the Related Art

As a drawing apparatus used to manufacture a device such as a semiconductor integrated circuit, Japanese Patent Laid-Open No. 2005-129944 proposes a drawing apparatus that performs drawing simultaneously on a plurality of shot regions of a substrate using a plurality of electron optical systems (charged particle optical systems).

When using the drawing apparatus described in Japanese Patent Laid-Open No. 2005-129944, if the plurality of electron optical systems draw identical (corresponding) places in the different shot regions, drawing data used by the plurality of electron optical systems can be shared. This makes it possible to reduce the scale of drawing data to be held and handled. Moreover, if the electron optical systems have almost identical regions such as dicing line regions where a pattern formation is unnecessary, the region can be advantageously skipped, thereby achieving high throughput.

The drawing data used by a plurality electron optical systems can be shared if there is a simple integer ratio relationship between a pitch Ps of a shot region on a wafer 10 and a pitch (distance between the optical axes of the adjacent optical systems) Pc of the plurality of electron optical systems shown in FIGS. 1A and 1B. As shown in FIG. 1B, however, if a shot size of the wafer 10 as a drawing target changes, the integer ratio relationship between the pitch Ps of the shot region and the pitch Pc of electron optical systems Col_1, Col_2, and Col_3 does not hold. In this case, it may be impossible to share the drawing data. In FIG. 1B, the electron optical systems Col_1 to Col_3 emit a plurality of electron beams. When the wafer 10 is moved to the upper side of FIG. 1B with respect to the electron optical systems Col_1 to Col_3 by a stage on which the wafer 10 is placed, the electron optical systems Col_1 to Col_3 draw stripe regions S1 to S3, respectively. In the stripe drawing, multiple drawing is performed on the wafer 10 by the electron beams in a plurality of rows of the electron optical systems Col_1 to Col_3 which are arrayed in the moving direction of the wafer 10. The irradiating doses of the electron beams on the wafer 10 at the same position are controlled by on/off-controlling irradiation (or blanking) of the electron beams.

In the drawing apparatus described in Japanese Patent Laid-Open. No. 2005-129944, since the integer ratio relationship between the pitch Ps of the shot region and the pitch Pc of electron optical systems does not hold in some wafers as drawing targets, pattern data for the respective stripe drawings changes depending on the electron optical systems. For this reason, the drawing data cannot be shared among the plurality of electron optical systems. This is disadvantageous in reducing the scale of drawing data to be handled in parallel and enhancing throughput.

SUMMARY OF THE INVENTION

The present invention provides, for example, a drawing apparatus advantageous in terms of use of drawing data common for a plurality of charged particle optical systems.

The present invention in one aspect provides a drawing apparatus for performing drawing on a substrate with a charged particle beam, the apparatus comprising: a plurality of charged particle optical systems arranged along a first direction; a storage configured to store drawing data shared by the plurality of charged particle optical systems with respect to each of sub-drawing regions obtained by dividing a drawing region on the substrate of each of the plurality of charged particle optical systems in the first direction; and a controller configured to determine a drawing region on the substrate by each of the plurality of charged particle optical systems as set of the sub-drawing regions, and control each of the plurality of charged particle optical systems based on a corresponding set of the sub-drawing regions.

Further features of the present invention will become apparent from the following description of exemplary embodiments with reference to the attached drawings.

BRIEF DESCRIPTION OF THE DRAWINGS

FIGS. 6A to 6D are views for explaining a drawing method according to the second embodiment.

DESCRIPTION OF THE EMBODIMENTS

Figure 1A:
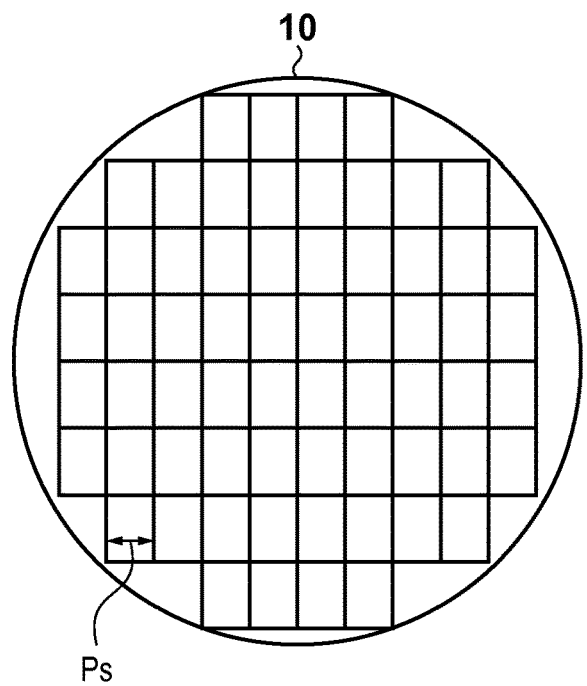
FIGS. 1A and 1B are views for explaining shot layouts and pitches of electron optical systems.
Figure 1B:
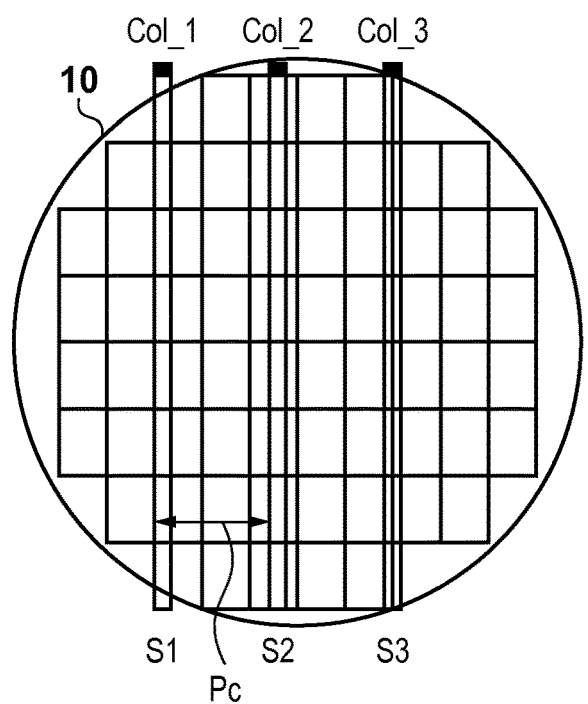

The embodiments of the present invention will be described below with reference to the accompanying drawings. Note that the same reference numerals denote the same members and the like in principle throughout the drawings for explaining the embodiments, and a repetitive description thereof will be omitted.

[First Embodiment]

Figure 2:
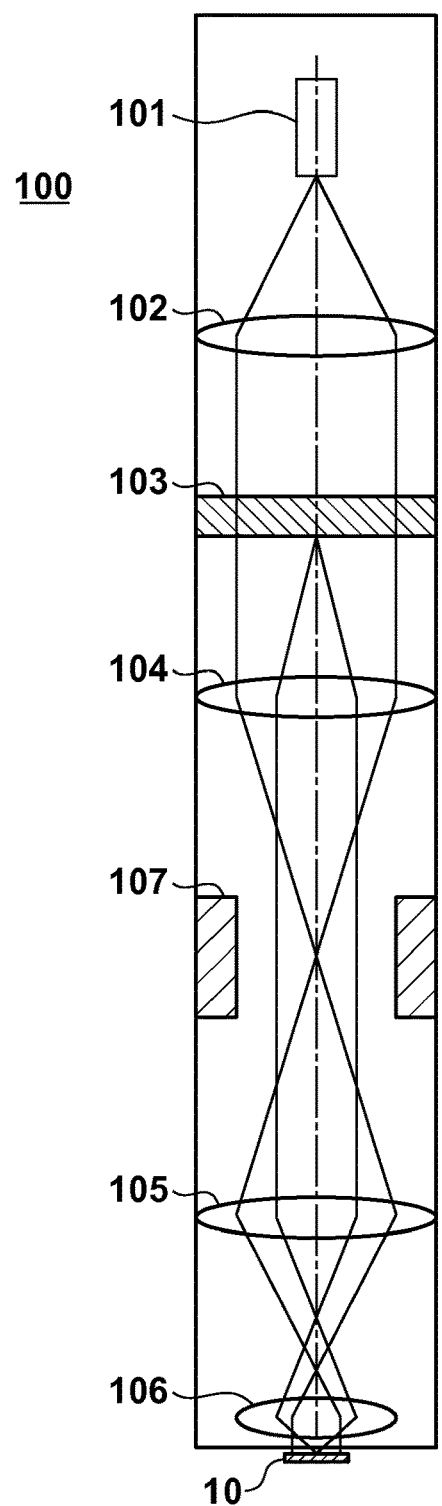
FIG. 2 is a view showing the arrangement of an electron optical system.

FIG. 2 is a view showing the arrangement of a plurality of electron optical systems (charged particle optical systems) 100 included in a drawing apparatus of the present invention. An electron source 101 is a so-called thermoelectron (thermal electron) emission electron source including, for example, $LaB_6$ or BaO/W (dispenser cathode) as an electron emitting material. A collimator lens 102 is, for example, an electrostatic lens configured to converge an electron beam by an electric field. An electron beam emitted by the electron source 101 changes to an almost parallel electron beam via the collimator lens 102.

A blanking aperture array 103 divides the almost parallel electron beam from the collimator lens 102 into a plurality of electron beams by two-dimensionally arrayed apertures (not shown). Irradiation of a wafer (substrate) 10 of the electron optical system 100 with the plurality of divided electron beams is on-off-controlled by an individually drivable electrostatic blanker (not shown). Note that blanking (irradiation off) of an electron beam can be performed by, for example, an arrangement including a deflector, but may be done by another arrangement. An electrostatic electron lens 104 and a magnetic field electron lens 105 form an intermediate image of the plurality of apertures of the blanking aperture array 103 by their lens effects. A magnetic field electron lens 106 acts as an objective lens and projects the intermediate image onto the wafer 10. A deflector 107 deflects the plurality of electron beams that have passed through the blanking aperture array 103 in a predetermined direction at once, thereby moving the drawing position.

Figure 3:
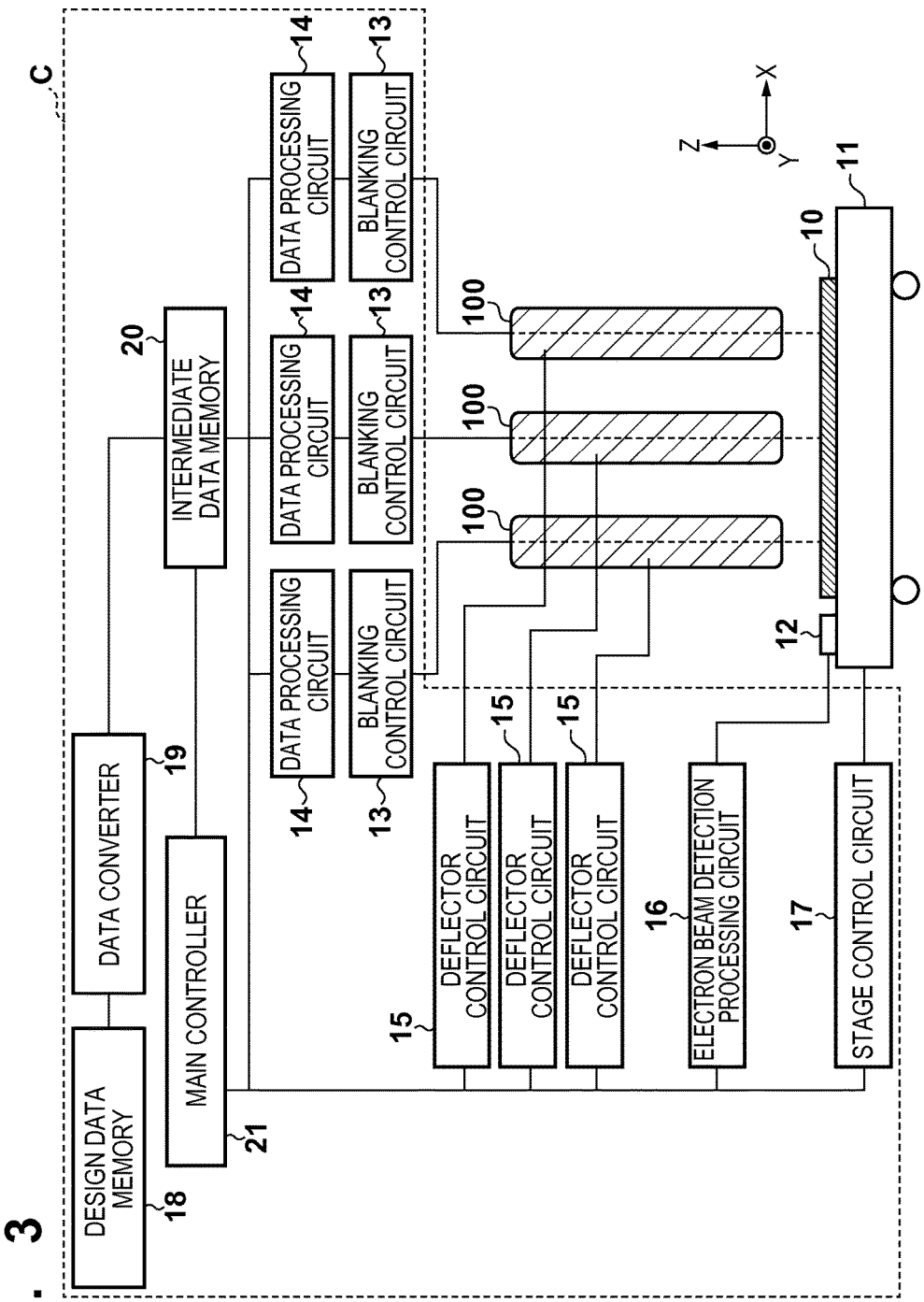
FIG. 3 is a block diagram showing a drawing apparatus.

FIG. 3 is a block diagram showing the arrangement of the drawing apparatus for performing drawing simultaneously on a plurality of shot regions of a substrate using the plurality of electron optical systems 100. Note that the drawing apparatus according to this embodiment performs drawing on a substrate by a plurality of electron beams. However, a charged particle beam other than the electron beam, for example, an ion beam may be used. The drawing apparatus can be generalized as a drawing apparatus in which a plurality of charged particle optical systems are arranged. Three electron optical systems 100 are arranged in the drawing apparatus according to this embodiment. A stage 11 holds the wafer 10 and when performing drawing can move along a first direction (X direction) and a second direction (Y direction) perpendicular to the first direction relative to the plurality of electron optical system 100. The stage 11 includes an electrostatic chuck (not shown) configured to hold the wafer 10, and a detector 12 configured to detect the positions and the current values of the electron beams entering the wafer 10.

Each blanking control circuit 13 individually controls the blanking aperture array 103 of the electron optical system 100. Each data processing circuit 14 includes a buffer memory and generates control data of the blanking control circuit 13 for each electron optical system 100. Each deflector control circuit 15 individually controls the deflector 107 of the electron optical system 100. An electron beam detection processing circuit 16 calculates coordinate values and current values of the actual irradiation positions of the respective electron beams based on a signal from the detector 12. A stage control circuit 17 controls positioning of the stage 11 in cooperation with laser interferometers (not shown) configured to measure the position of the stage 11.

A design data memory 18 stores design graphic data of a shot pattern to be drawn. A data converter 19 converts the design graphic data into intermediate graphic data which is sharable by the plurality of electron optical systems 100 for each partial region (sub-drawing region) obtained by dividing a width Wc on a drawing region of the substrate of the electron optical systems 100 by an integer α equal to or larger than two. An intermediate data memory (storage) 20 stores the intermediate graphic data in a compressed form for each partial region.

A main controller 21 determines the drawing region on the substrate of the electron optical systems 100 as a set of partial regions based on the interval of the electron optical systems 100 in the first direction. Then, the main controller 21 controls the drawing region on the substrate of the electron optical systems 100 as the corresponding set of partial regions. In accordance with a pattern to be drawn, the main controller 21 transfers the intermediate graphic data to the buffer memory of each of the data processing circuits 14 and controls the above-described plurality of control circuits and processing circuits 13 to 17, thereby generally controlling the drawing apparatus. The main controller 21 and the above-described plurality of control circuits, processing circuits 13 to 17 and the like constitute a controller C of the drawing apparatus.

Figure 4B:
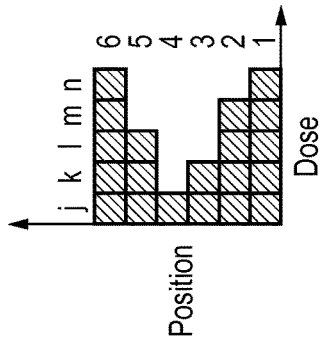
FIGS. 4A to 4C are views for explaining a multiple drawing method.
Figure 4A:
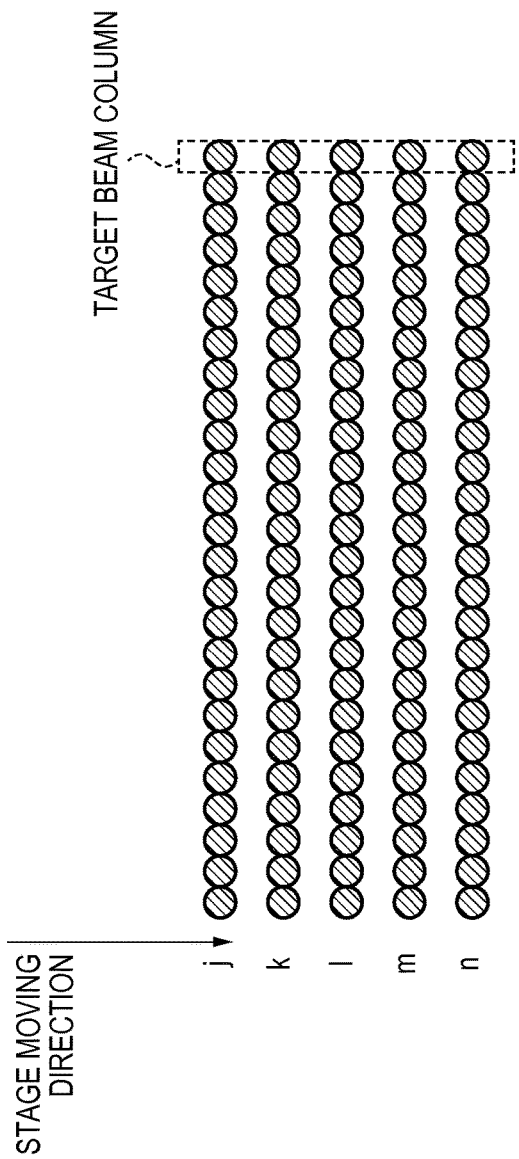
Figure 4C:
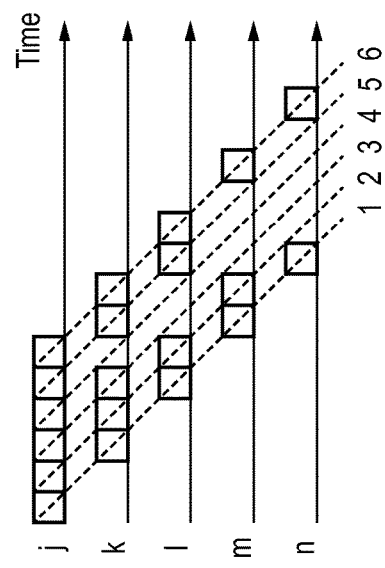

FIGS. 4A to 4C are views for explaining a basic drawing method of the drawing apparatus according to this embodiment. FIG. 4A illustrates the array of electron beams on the wafer 10 of the electron optical systems 100. In this embodiment, the electron beam array includes 5 (rows)×20 (columns) electron beams. The row pitch is twice larger than the column pitch. As shown by an arrow in FIG. 4A, the stage 11 moves from the upper side to the lower side of the drawing. A method of performing drawing by the target electron beam array shown in FIG. 4A using an exposure pattern of a designated exposure dose at positions 1 to 6 in the same column on the wafer 10 as shown in FIG. 4B will be explained here. All electron beams irradiate the wafer 10 by the same clock. Assume that the rows of the target electron beam array are represented by j to n, and the stage 11 continuously moves at a speed to move by one column pitch on a unit clock basis. At this time, when a time table of on/off signals on a unit clock basis of the rows (j to n) of the target electron beam array are set as shown in FIG. 4C, an exposure pattern as shown in FIG. 4B is obtained. Referring to FIG. 4C, lines 1 to 6 are the on/off signals of the rows (j to n) exposed at the same positions 1 to 6 on the wafer 10. Since the stage 11 moves by one row pitch by two unit clocks, the lines at identical positions shift by the two unit clocks per one tow. That is, the exposure pattern as shown in FIG 4B is obtained by adding the electron beams of the rows j to n shifted by the two unit clocks, and the number of rows in which the electron beams are turned on controls the tone of the exposure pattern. Therefore, the exposure pattern is obtained only after the electron beams of all rows j to n end the drawing. The total width of the plurality of columns of the electron beams shown in FIG. 4A corresponds to a width Wc of the drawing enable region set by the drawing apparatus. In actuality, on the wafer, a column pitch is several ten nm and the number of columns is 4,000, so the width Wc of the drawing enable region is 80 to 100 µm.

Figure 5A:
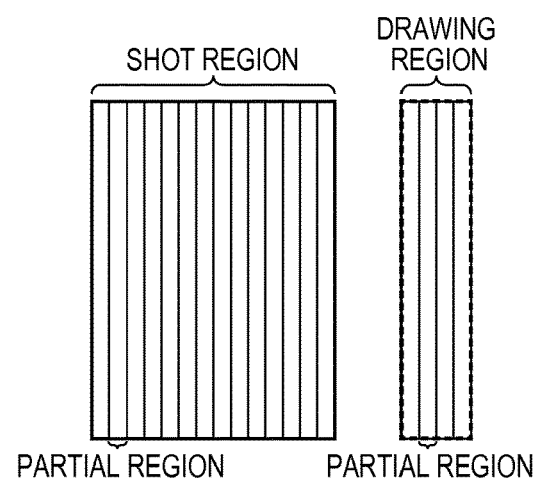
FIGS. 5A to 5C are views for explaining a generation process and a drawing method of drawing data of the drawing apparatus according to the first embodiment.

A generation process and a drawing method of the drawing data of the drawing apparatus according to the first embodiment will be described below. In this embodiment, as shown in FIG. 5A, a shot region (width Ws about 20 to 25 mm) is divided into partial regions each having a width Wd. One partial region is obtained by dividing the drawing region on the substrate of the electron optical systems 100 by an integer. Strictly speaking, the shot region is indivisible by the partial regions, thus producing a fraction. However, since the with of each partial region is about 5 to 10 µm, ignoring the fraction has little effect on others. Each partial region is a drawing region constituted by about 256 electron beams.

Figure 5B:
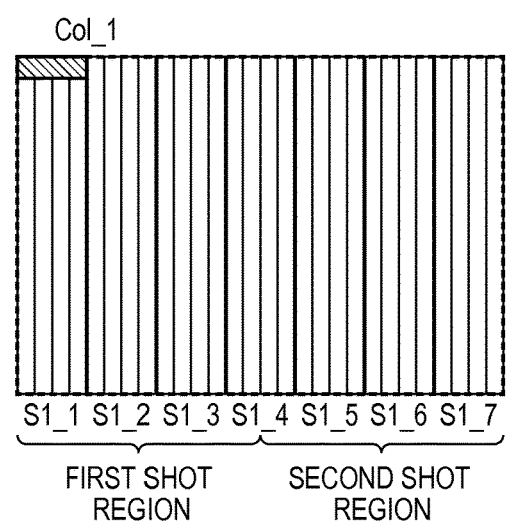
Figure 5C:
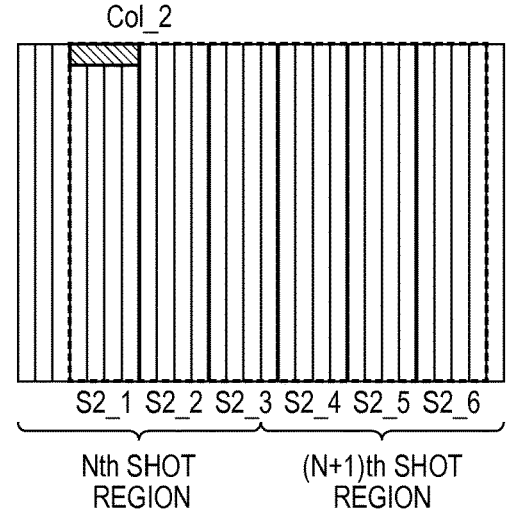

In step 1, based on shot layout information of the wafer 10 as a drawing target, the main controller 21 calculates a plurality of partial regions divided by the same width Wd from the drawing region on the substrate of the electron optical systems 100. In FIG. 5A, one shot region is divided into fourteen partial regions. Furthermore, in FIG. 5A, the drawing region obtained by one drawing by the electron optical systems 100 includes four partial regions. FIG. 5B shows a state of drawing by a first electron optical system Col_1. When the drawing apparatus starts drawing, drawing data for each drawing operation for the first electron optical system Col_1 is generated so that one edge (left edge) of the first shot region matches that of a first partial region S1_1 of the first electron optical system Col_1. FIG. 5C shows a state of drawing by a second electron optical system. Col_2. Typically, the ratio between the width (pitch) of the shot region and the pitch of the electron optical system 100 is not a ratio between integers. Therefore, a line segment (left edge) which defines the both edges of a first drawing region S2_1 of the second electron optical system Col_2 when the drawing apparatus starts drawing does not match the left edge of the Nth shot region. For this reason, the main controller 21 detects a partial region which is closest to the left edge of the first drawing region S2_1 among the partial regions which constitute the Nth shot region. Then, the main controller 21 generates drawing data for each drawing operation for the second electron optical system. Col_2 so that a boundary line of the detected partial region matches the left edge of the first drawing region S2_1 of the second electron optical system Col_2. The deflector control circuit 15 for the second electron optical system. Col_2 causes the deflector 107 to adjust the drawing region of the second electron optical system. Col_2 so that the left edge of the detected partial region matches that of the first drawing region S2_1 of the second electron optical system Col_2.

In step 2, upon receiving a drawing instruction, the main controller 21 successively generates drawing data for each drawing operation in a drawing order based on a drawing data generation rule set for each electron optical system from compressed data of the partial region basis stored in the intermediate data memory 20. In step 3, each of the data processing circuits 14 decompresses the drawing data compressed on the partial region basis, and converts it into data for the blanking control circuit, thereby storing in a double buffer memory (capable of storing two drawing regions).

In step 4, the main controller 21 causes each of the electron optical systems to draw one drawing region by causing each of the data processing circuits 14 to drive the blanking control circuit 13 and causing the stage control circuit 17 to continuously move the stage 11 in the Y direction (scanning direction). In step 5, upon completing the drawing of one drawing region, the main controller 21 draws the next drawing region based on the drawing data of the next drawing region which is stored in the other face of the two-face buffer memory. Simultaneously with the drawing, the main controller 21 generates the drawing data of the drawing region to be drawn next based on the drawing data generation rule, and transfers it to each of the data processing circuits 14. Moreover, the main controller 21 causes the data processing circuits 14 to decompress the drawing data of the drawing region compressed on the partial region basis, and overwrites, with it, one partial drawing region data of the double buffer which has undergone the drawing.

Following the above-described procedure, it is possible to easily and quickly generate the drawing data for each drawing region of each electron optical system from shared data on the basis of the partial regions stored in the intermediate memory data even if a shot pattern size changes. Accordingly, the simplification of the apparatus and substantially high throughput can be achieved.

[Second Embodiment]

When a width Ws of the shot region is not an integer multiple of a width βWd of the drawing region, the drawing regions are different for the respective shot regions in an alignment direction of the drawing regions even in one electron optical system, as in FIG. 5B showing the first embodiment. In the second embodiment, however, the drawing regions are identical for the respective shot regions in the alignment direction of the drawing regions in one electron optical system.

A generation process and a drawing method of the drawing data will be described with reference to FIGS. 6A to 6D. FIGS. 6A And 6B show a state of drawing by a first electron optical system Col_1. When a drawing apparatus starts drawing, a main controller 21 generates data of drawing regions S1_1 to S1_4 for drawing the first shot region so that, as shown in FIG. 6A, the left edge of the first shot region matches that of the first drawing region S1_1. The first electron optical system Col_1 draws the drawing regions in the order of S1_1 to S1_4 as shown in FIG. 6A. At that time, the first electron optical system Col_1 performs step movement (first step movement) of a wafer 10 by the width βWd after drawing one drawing region. Note that a blanking signal is set so as to off-control an electron beam which irradiates an adjacent second shot region of the data of the last drawing region S1_4.

In the first embodiment, when the first electron optical system Col_1 draws the second shot region, the step movement is performed by only the width βWd. In the second embodiment, however, when the first electron optical system Col_1 draws the second shot region, step movement (second step movement) of the wafer 10 is performed so that, as shown in FIG. 6B, the left edge of the second shot region matches that of the drawing region S1_1. This allows the first electron optical system Col_1 to use data of identical drawing regions in the first and the second shot regions.

While the first electron optical system Col_1 performs drawing as shown in FIGS. 6A and 6B, a second electron optical system. Col_2 performs drawing as shown in FIGS. 6C and 6D. FIG. 6C shows a state of the second electron optical system. Col_2 when the drawing apparatus starts drawing. Since the ratio between the pitch of the shot region and that of the electron optical system is not a ratio between integers, the left edge of the drawing region of the second electron optical system Col_2 at the start of drawing does not match that of the Nth shot region. When the first electron optical system Col_1 draws the drawing regions S1_1 to S1_4, the second electron optical system Col_2 draws drawing regions S2_1 to S2_4.

When the second electron optical system Col_2 starts drawing the next shot region, the step movement of the wafer 10 is performed so as to match with the relative positions of the shot region and drawing region when the second electron optical system Col_2 starts drawing the preceding shot region. This allows the second electron optical system Col_2 to use data of identical drawing regions in the Nth shot region, the (N+1)th shot region, and the like.

Therefore, in the second embodiment, shared data can be used even in another shot region in the alignment direction of the drawing region. This makes it possible to simplify the apparatus and achieve substantially high throughput.

[Third Embodiment]

Figure 7:
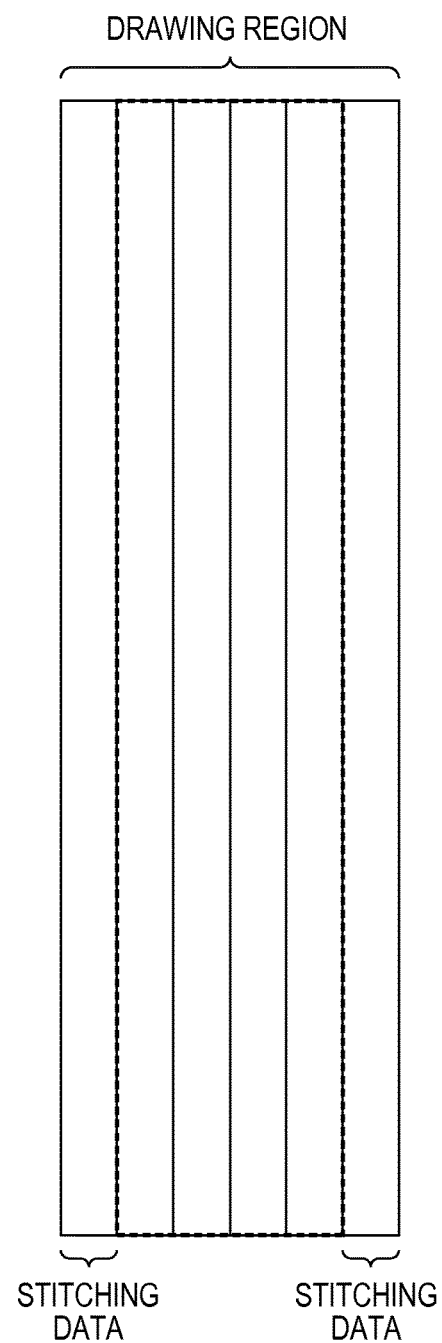
FIG. 7 is a view for explaining drawing data according to the third embodiment.

Since a drawing pattern may be divided due to a drawing positional shift between the drawing regions in the first and the second embodiments, multiple drawing is typically performed by making the drawing regions overlap each other. Hence, as shown in FIG. 7, data of a stitching region on the partial region basis may be added to the edge of drawing data on the drawing region basis.

[Fourth Embodiment]

A method of manufacturing an article according to embodiments of the present invention is suitable for manufacturing an article, for example, a micro device such as a semiconductor device or an element having a fine structure. The manufacturing method can include a step of forming a latent image pattern on a photoresist of a substrate with the photoresist applied on it using the drawing apparatus (a step of performing drawing on a substrate), and a step of developing the substrate on which the latent image pattern is formed in the above step. The manufacturing method can also include other known processes (for example, oxidation, deposition, vapor deposition, doping, planarization, etching, resist removal, dicing, bonding, and packaging). The method of manufacturing an article according to this embodiment is advantageous in at least one of the performance, quality, productivity, and production cost of the article, as compared to conventional methods.

An article manufacturing method according to an embodiment of the present invention is suitable for manufacturing a microdevice such as a semiconductor device, and an article such as an element having a microstructure. This manufacturing method can include a step of forming a latent image pattern on a photosensitive agent applied to a substrate by using the aforementioned lithography apparatus (step of forming a pattern on a substrate), and a step of developing the substrate on which the latent image pattern is formed in the preceding step. Further, the manufacturing method can include other well-known steps (for example, oxidization, deposition, vapor deposition, doping, planarization, etching, resist removal, dicing, bonding, and packaging). The article manufacturing method according to the embodiment is superior to a conventional method in at least one of the performance, quality, productivity, and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-134210, filed Jun. 26, 2013, which is hereby incorporated by reference herein in its entirety.

What is claimed is:

1. A drawing apparatus for performing drawing of a same pattern on each of a plurality of shot regions of a substrate with a charged particle beam, the apparatus comprising:
a plurality of charged particle optical systems arranged along a first direction, wherein a distance between adjacent two charged particle optical systems of the plurality of charged particle optical systems is greater than a width of each of the plurality of shot regions in the first direction, wherein the respective charged particle optical systems include respective electron sources and respective aperture arrays configured to divide one beam from the respective electron source into a plurality of beams, wherein each drawing region of each charged particle optical system is a region drawn by the plurality of projected beams from the respective aperture array, and wherein the respective charged particle optical systems draw simultaneously the respective drawing regions on different shot regions of the plurality of shot regions by moving the substrate, each drawing region including at least two sub-drawing regions;
a storage configured to store pattern data obtained by dividing a design pattern to be drawn on each shot region of the substrate into a plurality of partial regions, each partial region having a width of the sub-drawing region in the first direction; and
a controller configured to generate drawing data of the respective drawing regions on the different shot regions drawn by the respective charged particle optical systems using the stored pattern data and control the respective charged particle optical systems to perform the drawing in the respective drawing regions,
wherein a ratio between a pitch of the charged particle optical systems in the first direction and a pitch of the shot regions in the first direction is not an integer,
wherein when one of the adjacent two charged particle optical systems draws a first drawing region in a first shot region of the plurality of shot regions, the other of the adjacent two charged particle optical systems draws a second drawing region in a second shot region different from the first shot region of the plurality of shot regions,
wherein one edge of the first drawing region matches with one edge of the first shot region in the first direction,
wherein one edge of the second drawing region does not match with any edge of the second shot region in the first direction,
wherein the number of sub-drawing regions between the one edge of the second drawing region and the one edge of the second shot region in the first direction is less than the number of sub-drawing regions in the drawing region in the first direction, and
wherein the drawing data of the first drawing region includes the pattern data of a first partial region of the plurality of partial regions of the design pattern, and the drawing data of the second drawing region includes the pattern data of a second partial region different from the first partial region of the design pattern.

2. The apparatus according to claim 1, further comprising a stage configured to hold the substrate and be movable along the first direction,
wherein, in a case where the drawing is started, the controller is configured to control the stage such that the one edge of the first drawing region matches with the one edge of the first shot region in the first direction.

3. The apparatus according to claim 1, further comprising a stage configured to hold the substrate and be movable along the first direction,
wherein the controller is configured to control the plurality of charged particle optical systems and the stage such that drawing of the drawing region by each of the plurality of charged particle optical systems and step movement of the stage by a width of the drawing region in the first direction are repeated.

4. The apparatus according to claim 1, further comprising a stage configured to hold the substrate and be movable along the first direction,
wherein the controller is configured to control the plurality of charged particle optical systems and the stage such that a first drawing by a width of the shot region on of the substrate is performed by each of the plurality of charged particle optical systems by repeating the drawing of the drawing region by each of the plurality of charged particle optical systems and first step movement of the stage by the width of the drawing region in the first direction, and a second drawing by the width of the shot region on of the substrate is performed by each of the plurality of charged particle optical systems by repeating the drawing of the drawing region by each of the plurality of charged particle optical systems and second step movement of the stage by the width of the drawing region in the first direction, wherein a plurality of the corresponding set of regions of each of the plurality of charged particle optical systems in the second drawing are the same as a plurality of the corresponding set of regions of each of the plurality of charged particle optical systems in the first drawing.

5. The apparatus according to claim 1, wherein the drawing region includes, at an edge thereof, a sub-drawing region as a stitching region.

6. The apparatus according to claim 1, wherein the controller is further configured to:

cause the plurality of charged particle optical systems to perform the drawing to the first drawing region based on first drawing data;
cause the plurality of charged particle optical systems to perform the drawing to the second drawing region based on second drawing data;
generate third drawing data for a third drawing region where the drawing is to be performed next to the second drawing region; and
overwrite the first drawing data with the third drawing data.

7. A method of manufacturing an article, the method comprising the steps of:
performing drawing of a same pattern on each of a plurality of shot regions of a substrate using a drawing apparatus;
developing the substrate on which the drawing has been performed; and
processing the developed substrate to manufacture the article,
wherein the drawing apparatus performs drawing on the substrate with a charged particle beam, and includes:
a plurality of charged particle optical systems arranged along a first direction, wherein a distance between adjacent two charged particle optical systems of the plurality of charged particle optical systems is greater than a width of each of the plurality of shot regions in the first direction, wherein the respective charged particle optical systems include respective electron sources and respective aperture arrays configured to divide one beam from the respective electron source into a plurality of beams, wherein each drawing region of each charged particle optical system is a region drawn by the plurality of projected beams from the respective aperture array, and wherein the respective charged particle optical systems draw simultaneously the respective drawing regions on different shot regions of the plurality of shot regions by moving the substrate, each drawing region including at least two sub-drawing regions;
a storage configured to store pattern data obtained by dividing a design pattern to be drawn on each shot region of the substrate into a plurality of partial regions, each partial region having a width of the sub-drawing region in the first direction; and
a controller configured to generate drawing data of the respective drawing regions on the different shot regions drawn by the respective charged particle optical systems using the stored pattern data and control the respective charged particle optical systems to perform the drawing in the respective drawing regions,
wherein a ratio between a pitch of the charged particle optical systems in the first direction and a pitch of the shot regions in the first direction is not an integer,
wherein when one of the adjacent two charged particle optical systems draws a first drawing region in a first shot region of the plurality of shot regions, the other of the adjacent two charged particle optical systems draws a second drawing region in a second shot region different from the first shot region of the plurality of shot regions,
wherein one edge of the first drawing region matches with one edge of the first shot region in the first direction,
wherein one edge of the second drawing region does not match with any edge of the second shot region in the first direction,
wherein the number of sub-drawing regions between the one edge of the second drawing region and the one edge of the second shot region in the first direction is less than the number of sub-drawing regions in the drawing region in the first direction, and
wherein the drawing data of the first drawing region includes the pattern data of a first partial region of the plurality of partial regions of the design pattern, and the drawing data of the second drawing region includes the pattern data of a second partial region different from the first partial region of the design pattern.

8. The method of manufacturing an article according to claim 7, wherein the controller of the drawing apparatus is further configured to:
cause the plurality of charged particle optical systems to perform the drawing to the first drawing region based on first drawing data;
cause the plurality of charged particle optical systems to perform the drawing to the second drawing region based on second drawing data;
generate third drawing data for a third drawing region where the drawing is to be performed next to the second drawing region; and
overwrite the first drawing data with the third drawing data.

* * * * *